United States Patent
Kodama

(10) Patent No.: US 6,381,178 B1
(45) Date of Patent: Apr. 30, 2002

(54) NON-VOLATILE SEMICONDUCTOR MEMORY DEVICE AND METHOD OF REWRITING DATA STORED IN NON-VOLATILE SEMICONDUCTOR MEMORY DEVICE

(75) Inventor: Noriaki Kodama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/512,875

(22) Filed: Feb. 25, 2000

(30) Foreign Application Priority Data

Feb. 25, 1999  (JP) .......................... 11-047535

(51) Int. Cl.⁷ .............................................. G11C 16/04
(52) U.S. Cl. ........................... 365/185.28; 365/185.18; 365/185.19; 365/185.24; 365/185.01; 365/185.22; 365/185.26
(58) Field of Search ...................... 365/185.01, 185.28, 365/185.24, 185.18, 185.19, 185.22, 185.26

(56) References Cited

U.S. PATENT DOCUMENTS

| | | | | |
|---|---|---|---|---|
| 5,682,346 A | * | 10/1997 | Yamamura et al. | 365/185.18 |
| 5,748,530 A | * | 5/1998 | Gotou et al. | 365/185.18 |
| 6,046,935 A | * | 4/2000 | Takeuclu et al. | 365/185.03 |
| 6,181,600 B1 | * | 1/2001 | Seki et al. | 365/185.18 |
| 6,188,611 B1 | * | 2/2001 | Endoh et al. | 365/185.24 |

FOREIGN PATENT DOCUMENTS

| | | |
|---|---|---|
| JP | 7-73688 | 3/1995 |
| JP | 7-312093 | 11/1995 |
| JP | 7-326196 | 12/1995 |
| JP | 2645122 | 5/1997 |

* cited by examiner

Primary Examiner—Viet Q. Nguyen
(74) Attorney, Agent, or Firm—McGinn & Gibb, PLLC

(57) ABSTRACT

There is provided a non-volatile semiconductor memory device, including (a) a first gate insulating film formed on a channel region of a semiconductor substrate, (b) a floating gate electrode formed on the first gate insulating film, (c) a second gate insulating film formed on the floating gate electrode, (d) a control gate electrode formed on the second gate insulating film, and (e) an electric power source applying a gradually increasing voltage across the control gate electrode and the semiconductor substrate, the electric power source varying both an increment by which the voltage is increased and a period of time during which the voltage is kept constant, while data is being rewritten. The non-volatile semiconductor memory device is capable of increasing a rate at which data stored therein is deleted, without deleting data more than necessary.

10 Claims, 3 Drawing Sheets

NON-VOLATILE SEMICONDUCTOR MEMORY DEVICE AND METHOD OF REWRITING DATA STORED IN NON-VOLATILE SEMICONDUCTOR MEMORY DEVICE

BACKGROUND OF THE INVENTION

1. Field of the Invention

The invention relates to a non-volatile semiconductor memory device and a method of rewriting data stored in a non-volatile semiconductor memory device.

2. Description of the Related Art

FIG. 1 illustrates a structure of a conventional non-volatile memory cell having a floating gate electrode.

The illustrated non-volatile memory cell is comprised of a p-type semiconductor substrate 1, a first gate insulating film 4 formed on the p-type semiconductor substrate 1, a floating gate electrode 5 formed on the first gate insulating film 4 and composed of first polysilicon, a second gate insulating film 6 formed on the floating gate electrode 5 and having a three-layered structure of ONO (Oxide-Nitride-Oxide), and a control gate electrode 7 formed on the second gate insulating film 6 and composed of second polysilicon.

A source 2 and a drain 3 both comprised of a $n^+$ diffusion layer is formed at a surface of the p-type semiconductor substrate 1 at opposite sides of the duplex gates 5 and 7.

An electric power supply 8 applies a voltage across the control gate electrode 7 and the p-type semiconductor substrate 1.

For instance, Japanese Unexamined Patent Publications Nos. 7-73688, 7-312093 and 7-326196, and Japanese Patent Publication No. 2645122 (Japanese Unexamined Patent Publication No. 2-193398) have suggested a method of deleting data stored in such a non-volatile memory cell as illustrated in FIG. 1. In accordance with the suggested method, a gradually increasing voltage is applied across the control gate electrode 7 and the p-type semiconductor substrate 1.

Hereinbelow is explained the method with reference to FIGS. 2 and 3.

In the above-mentioned method of deleting data stored in a non-volatile memory cell, a voltage which is negative relative to the p-type semiconductor substrate 1 is applied to the control gate electrode 7 to thereby discharge electrons accumulated in the floating gate electrode 5, into the p-type semiconductor substrate 1. Such discharge of electrons is called Fowler-Nordheim tunnel discharge (hereinafter, referred to simply as "FN tunnel discharge").

In the method, pulses are applied at a voltage V1 to the control gate electrode 7 a predetermined number of times, when data starts being deleted, as illustrated in FIG. 2.

If data cannot be deleted even by applying the pulses at a voltage V1 to the control gate electrode 7, pulses are applied at a voltage V2 to the control gate electrode 7, as illustrated in FIG. 2. Herein, a voltage V2 is higher than a voltage V1 by a predetermined increment $\Delta$V1 (V2=V1+$\Delta$V1).

If data cannot be deleted even by applying the pulses at a voltage V2 to the control gate electrode 7, pulses are applied at a voltage V3 to the control gate electrode 7, as illustrated in FIG. 2. Herein, a voltage V3 is higher than a voltage VS by a predetermined increment $\Delta$V1 (V3=V2+$\Delta$V1).

Thereafter, a voltage applied to the control gate electrode 7 is gradually increased by a predetermined increment $\Delta$V1, until data stored in the non-volatile memory cell is completely deleted.

A voltage to be applied to the control gate electrode 7 is gradually increased in the following two manners.

Firstly, a voltage increment $\Delta$V1 is determined to be relatively high, and a step time $\Delta$t1 during which a voltage applied to the control gate electrode 7 is kept constant is determined to be relatively short, as shown with a solid line in FIG. 2.

Secondly, a voltage increment $\Delta$V2 is determined to be relatively small, and a step time $\Delta$t2 during which a voltage applied to the control gate electrode 7 is kept constant is determined to be relatively long, as shown with a broken line in FIG. 2.

When the voltage increment $\Delta$V1 is determined to be relatively high, and the step time $\Delta$t1 is determined to be relatively short, as shown with the solid line in FIG. 2, it would be possible hasten deleting data to a desired degree. However, if the voltage is increased just before data is deleted to a desired degree, data is over-deleted more than necessary, because a voltage increment is higher than the voltage increment $\Delta$V1, and hence, a level of deletion of data is over a desired level of deletion of data after the voltage has been increased, as shown with a solid line 9 in FIG. 3.

In contrast, when the voltage increment $\Delta$V2 is determined to be relatively small, and the step time $\Delta$t2 is determined to be relatively long, as shown with a broken line in FIG. 2, it would be possible to prevent data from being over-deleted in such a way as mentioned above. However, since the voltage increment $\Delta$V2 is smaller than the voltage increment $\Delta$V1, data is deleted at a lower rate, which means that it would take longer time to delete data to a desired degree, as shown with a broken line 10 in FIG. 3.

SUMMARY OF THE INVENTION

In view of the above-mentioned problem in the conventional non-volatile semiconductor memory device, it is an object of the present invention to provide a non-volatile semiconductor memory device which is capable of increasing a rate at which data is deleted without over-deletion of data.

It is also an object of the present invention to provide a method of deleting data stored in a non-volatile semiconductor memory device, which method is capable of doing the same.

In one aspect of the present invention, there is provided a non-volatile semiconductor memory device, including (a) a first gate insulating film formed on a channel region of a semiconductor substrate, (b) a floating gate electrode formed on the first gate insulating film, (c) a second gate insulating film formed on the floating gate electrode, (d) a control gate electrode formed on the second gate insulating film, and (e) an electric power source applying a gradually increasing voltage across the control gate electrode and the semiconductor substrate, the electric power source varying both an increment by which the voltage is increased and a period of time during which the voltage is kept applied, while data is being rewritten.

The electric power source may vary both the increment and the period of time at a predetermined time, in which case, it is preferable that the electric power source applies such a voltage that a first increment is smaller than a second increment and that a first period of time is longer than a second period of time. The first increment is defined as an increment by which the voltage is increased after the predetermined time, the second increment is defined as an increment by which the voltage is increased prior to the predetermined time, the first period of time is defined as a period of time during which the voltage is kept constant after the predetermined time, and the second period of time is defined as a period of time during which the voltage is kept constant prior to the predetermined time.

The electric power source may vary both the increment and the period of time at each of a plurality of predetermined times, in which case, it is preferable that the electric power source applies such a voltage that a first increment is smaller than a second increment and that a first period of time is longer than a second period of time, the first increment being defined as an increment by which the voltage is increased after the each of a plurality of predetermined times, the second increment being defined as an increment by which the voltage is increased prior to the each of a plurality of predetermined times, the first period of time being defined as a period of time during which the voltage is kept constant after the each of a plurality of predetermined times, and the second period of time being defined as a period of time during which the voltage is kept constant prior to the each of a plurality of predetermined times.

In another aspect of the present invention, there is provided a method of rewriting data stored in a non-volatile semiconductor memory device comprised of (a) a first gate insulating film formed on a channel region of a semiconductor substrate, (b) a floating gate electrode formed on the first gate insulating film, (c) a second gate insulating film formed on the floating gate electrode, and (d) a control gate electrode formed on the second gate insulating film, the method including the step of applying a gradually increasing voltage across the control gate electrode and the semiconductor substrate, wherein both an increment by which the voltage is increased and a period of time during which the voltage is kept constant are varied, while data is being rewritten.

The method may further include the steps of (a) predetermining a time, and (b) varying both the increment and the period of time at the thus predetermined time, in which case, it is preferable that the increment and the period of time are varied such that a first increment is smaller than a second increment and that a first period of time is longer than a second period of time, the first increment being defined as an increment by which the voltage is increased after the predetermined time, the second increment being defined as an increment by which the voltage is increased prior to the predetermined time, the first period of time being defined as a period of time during which the voltage is kept constant after the predetermined time, and the second period of time being defined as a period of time during which the voltage is kept constant prior to the predetermined time.

The method may further include the steps of (a) predetermining a plurality of times, and (b) varying both the increment and the period of time at each of the thus predetermined times, in which case, it is preferable that the increment and the period of time are varied such that a first increment is smaller than a second increment and that a first period of time is longer than a second period of time, the first increment being defined as an increment by which the voltage is increased after each of the predetermined times, the second increment being defined as an increment by which the voltage is increased prior to each of the predetermined times, the first period of time being defined as a period of time during which the voltage is kept constant after each of the predetermined times, and the second period of time being defined as a period of time during which the voltage is kept constant prior to each of the predetermined times.

The advantages obtained by the aforementioned present invention will be described hereinbelow.

In accordance with the present invention, a voltage increment is set relatively high and a period of time during which an increased voltage is kept constant is set relatively short, before a threshold voltage of the non-volatile semiconductor memory device reaches a predetermined final threshold voltage, whereas a voltage increment is set relatively small and a period of time during which an increased voltage is kept constant is set relatively long, after a threshold voltage of the non-volatile semiconductor memory device has reached a predetermined final threshold voltage.

Before a threshold voltage of the non-volatile semiconductor memory device reaches a predetermined final threshold voltage, a mass of electrons are accumulated in the floating gate electrode. Hence, a relatively low voltage is applied across the control gate electrode and the semiconductor substrate so as to weaken an electric field to be applied to the first gate insulating film, before a threshold voltage of the non-volatile semiconductor memory device reaches a predetermined final threshold voltage. As electrons accumulated in the floating gate electrode are discharged, that is, as data is deleted, a voltage applied across the control gate electrode and the semiconductor substrate is increased. In accordance with development of data deletion, a voltage increment is determined to be smaller and a period of time during which a voltage is kept constant is determined to be longer.

By varying a voltage to be applied across the control gate electrode and the semiconductor substrate, in the above-mentioned manner, it would be possible to weaken as much as possible an electric field applied to the first gate insulating film while data is being deleted, and to increase a rate at which data is deleted, that is, to shorten a period of time necessary for deleting data stored in a nonvolatile semiconductor memory device.

It would be also possible to prevent that a threshold voltage of the nonvolatile semiconductor memory device exceeds a predetermined final threshold voltage just before data deletion finishes, that is, data is over-deleted.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
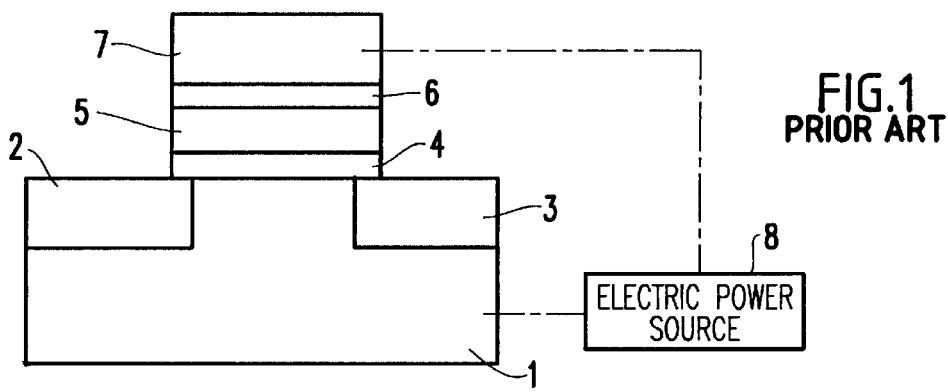
FIG. 1 is a cross-sectional view of a conventional non-volatile semiconductor memory device.
Figure 2:
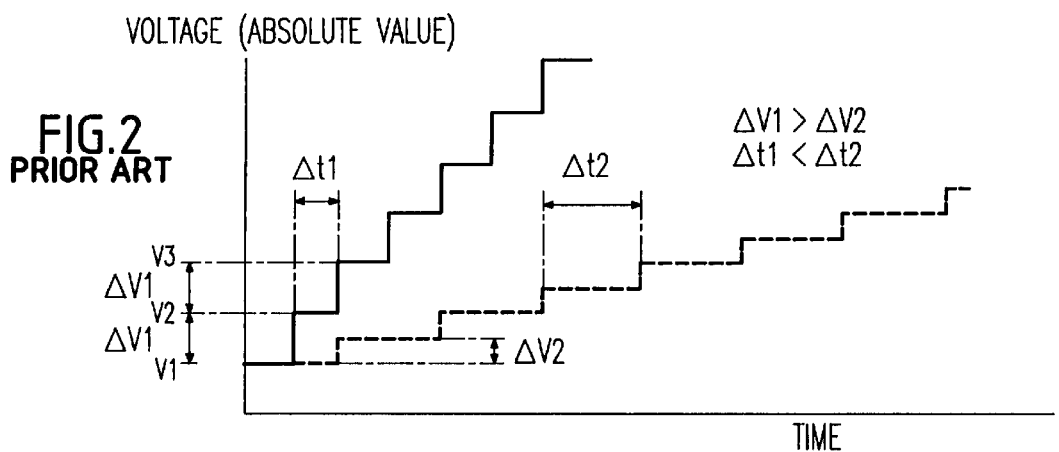
FIG. 2 is a graph showing a relation between a voltage to be applied to a non-volatile semiconductor memory device for deleting data, and a total period of time during which the voltage is applied.
Figure 3:
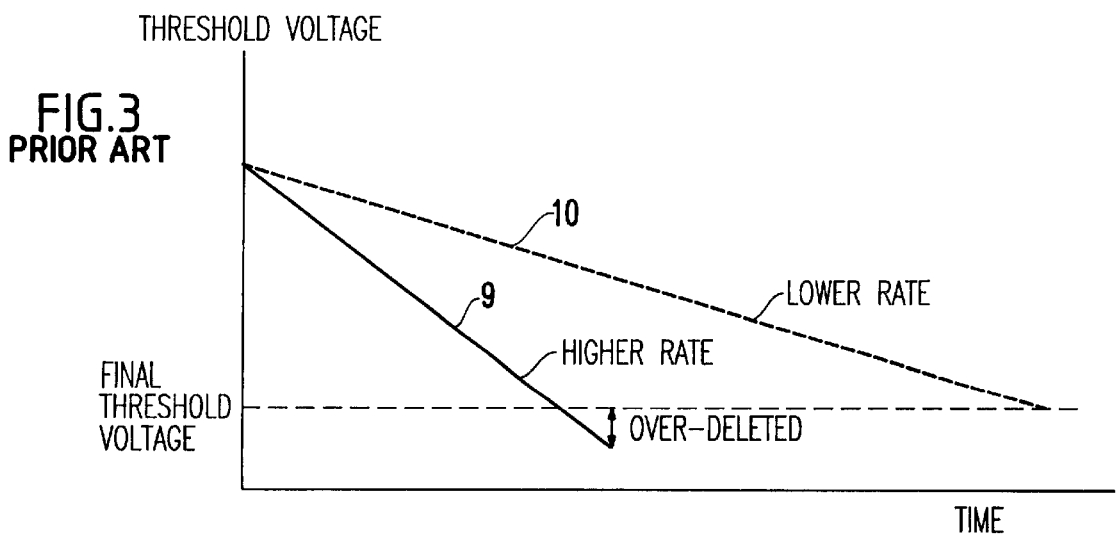
FIG. 3 is a graph showing a relation between a threshold voltage of the non-volatile semiconductor memory device illustrated in FIG. 1, and a period of time during which a voltage is applied for deleting data.
Figure 4:
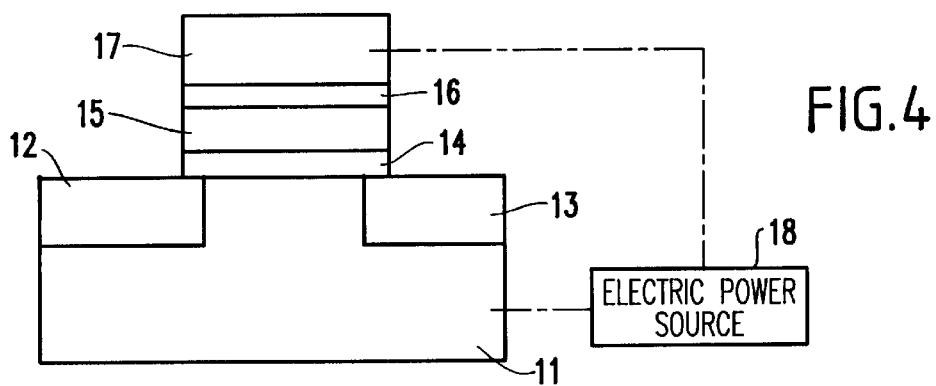
FIG. 4 is a cross-sectional view illustrating a non-volatile semiconductor memory device in accordance with a preferred embodiment of the present invention.

FIG. 4 illustrates a non-volatile semiconductor memory device in accordance with an embodiment of the present invention.

The non-volatile semiconductor memory device is comprised of a p-type semiconductor substrate 11, a duplex gate structure formed on the p-type semiconductor substrate 11, and an electric power source 18.

The duplex gate structure is comprised of a first gate insulating film 14 formed on the p-type semiconductor substrate 1 and having a thickness of about 100 angstroms, a floating gate electrode 15 formed on the first gate insulating film 14 and composed of first polysilicon, a second gate insulating film 16 formed on the floating gate electrode 15, having a three-layered structure of ONO (Oxide-Nitride-Oxide), and having a thickness of about 200 angstroms in equivalence of a thickness of an oxide film, and a control gate electrode 17 formed on the second gate insulating film 16 and composed of second polysilicon.

A source 12 and a drain 13 both comprised of a $n^+$ diffusion layer is formed at a surface of the p-type semiconductor substrate 11 at opposite sides of the duplex gate structure.

Figure 5:
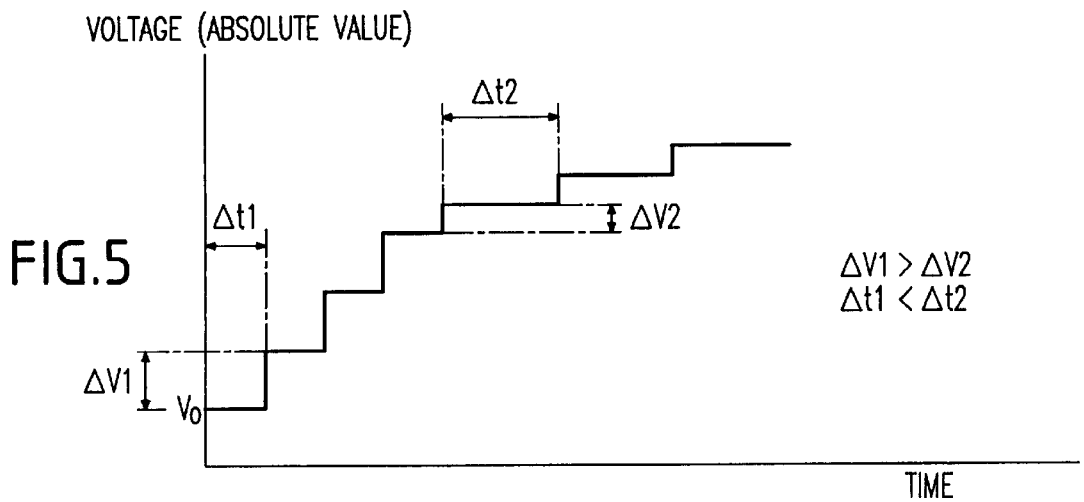
FIG. 5 is a graph showing a relation between a voltage to be applied to the non-volatile semiconductor memory device illustrated in FIG. 4 for deleting data, and a total period of time during which the voltage is applied.

The electric power supply 18 applies pulse voltages as illustrated in FIG. 5, across the control gate electrode 17 and the p-type semiconductor substrate 11.

Hereinbelow is explained a method of deleting data stored in the non-volatile semiconductor memory device illustrated in FIG. 4.

When data is to be read out of the non-volatile semiconductor memory device, 1V, 0V and 5V are applied to the drain 13, the source 12 and the control gate electrode 17, respectively. Then, a state "0" or "1" is determined in accordance with a high or low level of a drain current. When electrons are accumulated in the floating gate electrode 15, a drain current is in a high level, whereas when no electrons are accumulated in the floating gate electrode 15, a drain current is in a low level.

When data is to be written into the non-volatile semiconductor memory device, about 6V, 0V and 12V are applied to the drain 13, the source 12 and the control gate electrode 17, respectively, for instance. Application of those voltages cause impact ionization in the vicinity of the drain 13, resulting in that electrons are introduced into the floating gate electrode 15, that is, data is written into the non-volatile semiconductor memory device.

As a result, electrons are sufficiently accumulated in the floating gate electrode 15, and a threshold voltage of the non-volatile semiconductor memory device is set equal to a relatively high voltage, for instance, 7V.

Data is deleted from the non-volatile semiconductor memory device by discharging electrons accumulated in the floating gate electrode 15, with a threshold voltage of the non-volatile semiconductor memory device being set equal to a relatively low voltage, for instance, 3V.

When electrons are to be discharged, both the source 12 and the drain 13 are rendered in floating condition, and a negative voltage V is applied across the semiconductor substrate 11 and the control gate electrode 17. As a result, electrons are discharged from the floating gate electrode 15 to the semiconductor substrate 11 through the first gate insulating film 14 by FN tunnel discharge phenomenon.

FIG. 5 illustrates a waveform of a voltage to be applied across the semiconductor substrate 11 and the control gate electrode 17 in the method of deleting data stored in the non-volatile semiconductor memory device.

As illustrated in FIG. 5, an initial voltage $V_0$ is initially applied across the semiconductor substrate 11 and the control gate electrode 17. After the initial voltage $V_0$ has been applied in a total maximum period of time $\Delta t1$, a voltage to be applied is increased by an increment $\Delta V1$. That is, a voltage of $(V_0+\Delta V1)$ is applied across the semiconductor substrate 11 and the control gate electrode 17.

Even when the voltage $(V_0+\Delta V1)$ is applied across the semiconductor substrate 11 and the control gate electrode 17, a threshold voltage of the non-volatile semiconductor memory device does not reach a predetermined threshold voltage, the voltage $(V_0+\Delta V1)$ is kept applied in a total period of time $\Delta t1$ at greatest.

Thereafter, a voltage to be applied across the semiconductor substrate 11 and the control gate electrode 17 is increased by an increment $\Delta V1$ every total period of time $\Delta t1$, before a threshold voltage of the non-volatile semiconductor memory device does not reach a predetermined threshold voltage.

After a threshold voltage of the non-volatile semiconductor memory device has reached a predetermined threshold voltage by applying a voltage which is increased by an increment $\Delta V1$ every total period of time $\Delta t1$, a voltage to be applied across the semiconductor substrate 11 and the control gate electrode 17 is increased by an increment $\Delta V2$ every total period of time $\Delta t2$. Herein, a total period of time $\Delta t1$ is smaller than a total period of time $\Delta t2$ ($\Delta t1<\Delta t2$), and the increment $\Delta V1$ is greater than the increment $\Delta V2$ ($\Delta V1>\Delta V2$).

Figure 6:
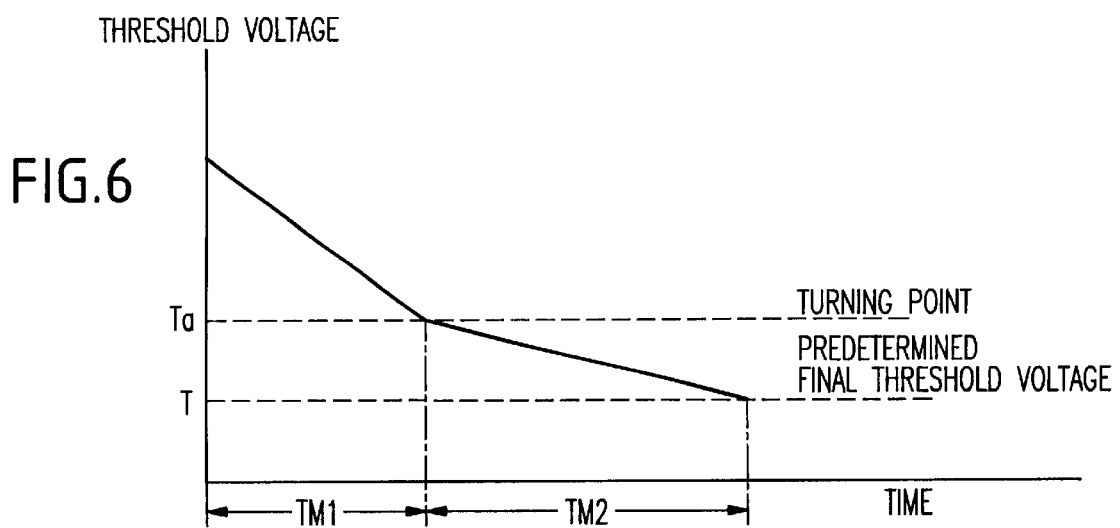
FIG. 6 is a graph showing a relation between a threshold voltage of the non-volatile semiconductor memory device illustrated in FIG. 4, and a period of time during which a voltage is applied for deleting data in the non-volatile semiconductor memory device illustrated in FIG. 4.

As having been explained so far, before a threshold voltage of the non-volatile semiconductor memory device reaches a predetermined turning point Ta, the voltage increment $\Delta V1$ is set relatively high, and a total maximum period of time $\Delta t1$ is set relatively short. Hence, as illustrated in FIG. 6, it is possible to shorten a time TM1 necessary for deleting data stored in the non-volatile semiconductor memory device.

After a threshold voltage of the non-volatile semiconductor memory device has reached the predetermined turning point Ta, the voltage increment $\Delta V2$ is set relatively small, and a total maximum period of time $\Delta t2$ is set relatively long. As a result, as illustrated in FIG. 6, even though a time TM2 necessary for deleting data stored in the non-volatile semiconductor memory device unavoidably becomes slightly long, it is possible to prevent that a threshold voltage of the non-volatile semiconductor memory device exceeds a predetermined threshold voltage, and accordingly, data is over-deleted.

Hereinbelow is explained an example of the method of deleting data stored in the non-volatile semiconductor memory device.

Figure 7:
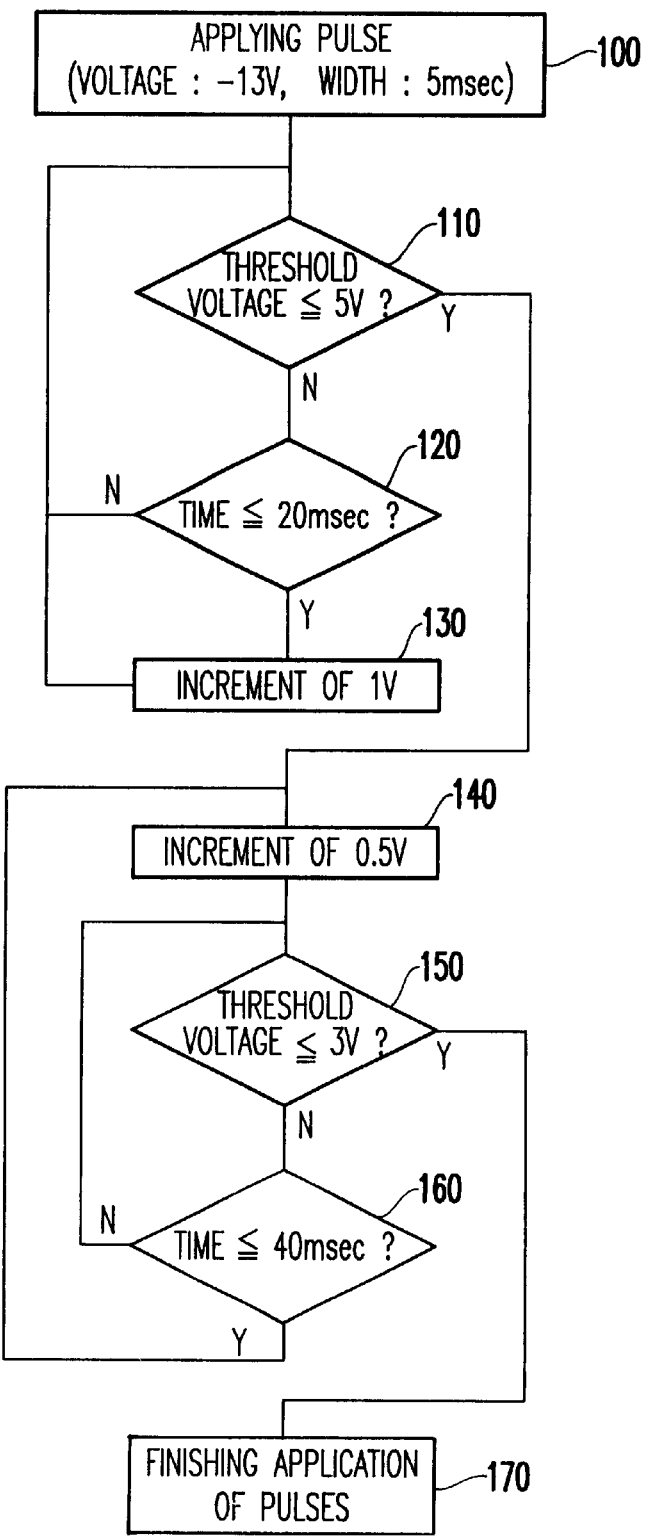
FIG. 7 is a flow chart illustrating respective steps to be carried out in a method of deleting data stored in a non-volatile semiconductor memory device, in accordance with a preferred embodiment of the present invention.

FIG. 7 is a flow chart illustrating respective steps of the example of the method.

It is assumed in this example that about 6V, 0V and 12V are applied to the drain 13, the source 12 and the control gate electrode 17, respectively, to thereby induce impact ionization in the vicinity of the drain 13 and introduce electrons into the floating gate electrode 15, and that a threshold voltage of the non-volatile semiconductor memory device is set relatively high, specifically, at 7V.

When data is to be deleted, both the source 12 and the drain 13 are rendered in floating condition, and a negative voltage is applied across the semiconductor substrate 11 and the control gate electrode 17. As a result, electrons are discharged from the floating gate electrode 15 to the semiconductor substrate 11 through the first gate insulating film 14 by FN tunnel discharge phenomenon, and hence, data is deleted.

In this example, pulses having a pulse width of 5 msec and a voltage of −13V are initially applied across the semiconductor substrate 11 and the control gate electrode 17 (step 100 in FIG. 7).

As the pulses are applied across the semiconductor substrate 11 and the control gate electrode 17, it is checked every certain period of time whether a threshold voltage of the non-volatile semiconductor memory device becomes equal to or smaller than 5V, for instance (step 110 in FIG. 7).

If a threshold voltage of the non-volatile semiconductor memory device is greater than 5V (NO in step 110), a total period of time during which the pulses are applied across the semiconductor substrate 11 and the control gate electrode 17 is calculated, and then, it is judged whether the thus calculated total period of time is equal to or smaller than 20 msec defined as a predetermined maximum period of time (step 120 in FIG. 7).

When the threshold voltage of the non-volatile semiconductor memory device is not below 5V, even if the pulses are applied across the semiconductor substrate 11 and the control gate electrode 17 in 20 msec (YES in step 120), the pulses are caused to have a voltage increased by 1V in an absolute value (step 130 in FIG. 7). That is, a voltage of the pulses is set equal to −14V.

Then, the steps 110, 120 and 130 are repeated.

Specifically, as the pulses having a voltage of −14V are applied to the applied across the semiconductor substrate 11 and the control gate electrode 17, it is checked every certain period of time whether a threshold voltage of the non-volatile semiconductor memory device becomes equal to or smaller than 5V (step 110 in FIG. 7).

If a threshold voltage of the non-volatile semiconductor memory device is greater than 5V (NO in step 110), a total period of time during which the pulses are applied across the semiconductor substrate 11 and the control gate electrode 17 is calculated, and then, it is judged whether the thus calculated total period of time is equal to or smaller than 20 msec defined as a predetermined maximum period of time (step 120 in FIG. 7).

When the threshold voltage of the non-volatile semiconductor memory device is not below 5V, even if the pulses having a voltage of −14V are applied across the semiconductor substrate 11 and the control gate electrode 17 in 20 msec (YES in step 120), the pulses are caused to have a voltage increased by 1V in an absolute value. That is, a voltage of the pulses is set equal to −15V.

As mentioned above, a voltage of the pulses is gradually increased by a voltage increment of 1V on condition that the same voltage is kept applied in 20 msec at greatest. Such a voltage is applied across the control gate electrode 17 and the semiconductor substrate 11 until a threshold voltage of the non-volatile semiconductor memory device becomes equal to or smaller than 5V (YES in step 110).

For instance, it is assumed that a threshold voltage of the non-volatile semiconductor memory device becomes equal to 5V when a total period of time during which a voltage of −15.5V is applied is 15 msec (YES in step 110).

In this case, a voltage to be applied is increased by 0.5V (step 140 in FIG. 7). That is, pulses having a pulse width of 5 msec and a voltage of −15.5V are applied across the semiconductor substrate 11 and the control gate electrode 17.

Then, as the pulses having a voltage of −15.5V are applied across the semiconductor substrate 11 and the control gate electrode 17, it is checked every certain period of time whether a threshold voltage of the non-volatile semiconductor memory device reaches 3V defined as a final threshold voltage (step 150 in FIG. 7).

If a threshold voltage of the non-volatile semiconductor memory device is greater than 3V (NO in step 150), a total period of time during which the pulses having a voltage of −15.5V are applied across the semiconductor substrate 11 and the control gate electrode 17 is calculated, and then, it is judged whether the thus calculated total period of time is equal to or smaller than 40 msec defined as a predetermined maximum period of time (step 160 in FIG. 7).

When the threshold voltage of the non-volatile semiconductor memory device is not below 3V, even if the pulses are applied across the semiconductor substrate 11 and the control gate electrode 17 in 40 msec (YES in step 160), the pulses are caused to have a voltage increased by 0.5V (step 140 in FIG. 7). That is, a voltage of the pulses is set equal to −16V.

As mentioned above, a voltage of the pulses is gradually increased by a voltage increment of 0.5V on condition that the same voltage is kept applied in 40 msec at greatest. Such a voltage is applied across the control gate electrode 17 and the semiconductor substrate 11 until a threshold voltage of the non-volatile semiconductor memory device becomes equal to or smaller than 3V (YES in step 150).

When a threshold voltage of the non-volatile semiconductor memory device reaches 3V defined as a final threshold voltage (YES in step 150), the pulses are stopped to be applied across the control gate electrode 17 and the semiconductor substrate 11.

In the above-mentioned embodiment, the turning point Ta of 5V (see FIG. 6) is defined as well as a final threshold voltage of 3V. Before a threshold voltage of the non-volatile semiconductor memory device reaches the turning point of 5V, a voltage increment is set relatively high (1V in the embodiment), and a period of time during which the same voltage is kept applied is set relatively short (20 msec in the embodiment). After a threshold voltage of the non-volatile semiconductor memory device has reached the turning point of 5V, a voltage increment is set relatively small (0.5V in the embodiment), and a period of time during which the same voltage is kept applied is set relatively short (40 msec in the embodiment).

As mentioned above, in accordance with embodiment, pulses having a lower voltage are initially applied across the control gate electrode 17 and the semiconductor substrate 11 in order to weaken an electric field applied to the first gate insulating film 14, because electrons are much accumulated in the floating gate electrode 15 and hence a threshold voltage of the non-volatile semiconductor memory device is relatively high.

Before a threshold voltage of the non-volatile semiconductor memory device reaches the turning point Ta, that is, when the threshold voltage is still high, a voltage of the pulses is increased by a greater increment to thereby cause the threshold voltage to reach the turning point Ta as soon as possible.

After the threshold voltage of the non-volatile semiconductor memory device reaches the turning point Ta, a voltage of the pulses is increased by a smaller increment, and a period of time during which the same voltage is kept applied is made longer.

By controlling a voltage to be applied across the control gate electrode 17 and the semiconductor substrate 11, in such a manner as mentioned above, it would be possible to weaken as much as possible an electric field applied to the first gate insulating film 14 during data is being deleted, and increase a rate at which data is deleted.

In addition, it is possible to almost equalize a threshold voltage of the non-volatile semiconductor memory device to a predetermined final threshold voltage with the threshold voltage being kept below the final threshold voltage.

Though the above-mentioned embodiment is designed to have only one turning point Ta, it should be noted that two or greater number of turning points may be defined.

For instance, a second intermediate threshold voltage of 4V may be defined as a second turning point, following the first intermediate threshold voltage of 5V defined as a first turning point in the above-mentioned embodiment. Between the first and second turning points, a voltage increment is set equal to 0.7V and a period of time during which the same voltage is kept applied is set equal to 30 msec, for instance.

An increase in the number of turning points brings an advantage that it is possible to shorten a time for a threshold voltage of the non-volatile semiconductor memory device to reach a final threshold voltage without allowing an electric field to be applied to the first insulating film 14 to grow while data is being deleted.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-47535 filed on Feb. 25, 1999 including specification, claims, drawings and summary is incorporated herein by reference in its entirety.

What is claimed is:

1. A non-volatile semiconductor memory device, comprising:
   (a) a first gate insulating film formed on a channel region of a semiconductor substrate;
   (b) a floating gate electrode formed on said first gate insulating film;
   (c) a second gate insulating film formed on said floating gate electrode;
   (d) a control gate electrode formed on said second gate insulating film; and
   (e) an electric power source applying a gradually increasing voltage across said control gate electrode and said semiconductor substrate, said electric power source varying both an increment by which said voltage is increased and a period of time during which said voltage is kept applied, while data is being rewritten.

2. The non-volatile semiconductor memory device as set forth in claim 1, wherein said electric power source varies both said increment and said period of time at a predetermined time.

3. The non-volatile semiconductor memory device as set forth in claim 2, wherein said electric power source applies such a voltage that a first increment is smaller than a second increment and that a first period of time is longer than a second period of time, said first increment being defined as an increment by which said voltage is increased after said predetermined time, said second increment being defined as an increment by which said voltage is increased prior to said predetermined time, said first period of time being defined as a period of time during which said voltage is kept constant after said predetermined time, and said second period of time being defined as a period of time during which said voltage is kept constant prior to said predetermined time.

4. The non-volatile semiconductor memory device as set forth in claim 1, wherein said electric power source varies both said increment and said period of time at each of a plurality of predetermined times.

5. The non-volatile semiconductor memory device as set forth in claim 4, wherein said electric power source applies such a voltage that a first increment is smaller than a second increment and that a first period of time is longer than a second period of time, said first increment being defined as an increment by which said voltage is increased after said each of a plurality of predetermined times, said second increment being defined as an increment by which said voltage is increased prior to said each of a plurality of predetermined times, said first period of time being defined as a period of time during which said voltage is kept constant after said each of a plurality of predetermined times, and said second period of time being defined as a period of time during which said voltage is kept constant prior to said each of a plurality of predetermined times.

6. A method of rewriting data stored in a non-volatile semiconductor memory device that includes a first gate insulating film formed on a channel region of a semiconductor substrate, a floating gate electrode formed on said first gate insulating film, a second gate insulating film formed on said floating gate electrode, and a control gate electrode formed on said second gate insulating film, said method, comprising:
   applying a voltage in a stepwise manner across a control gate electrode and a semiconductor substrate, wherein both an increment, by which said voltage is increased, and a period of time, during which said voltage is kept constant, are varied; and
   selecting a predetermined time at which said voltage is increased by said increment and said period of time is varied, wherein said increment and said period of time are varied such that a first increment is smaller than a second increment and a first period of time is longer than a second period of time, said first increment being defined as said increment by which said voltage is increased at said predetermined time, said second increment being defined as an increment by which said voltage is increased prior to said predetermined time, said first period of time being defined as a period of time during which said voltage is kept constant after said predetermined time, and said second period of time being defined as a period of time during which said voltage is kept constant prior to said predetermined time.

7. A method of rewriting data stored in a non-volatile semiconductor memory device that includes a first gate insulating film formed on a channel region of a semiconductor substrate, a floating gate electrode formed on said first gate insulating film, a second gate insulating film formed on said floating gate electrode, and a control gate electrode formed on said second gate insulating film, said method, comprising:

applying a voltage in a stepwise manner across a control gate electrode and a semiconductor substrate, wherein both an increment, by which said voltage is increased, and a period of time, during which said voltage is kept constant, are varied; and selecting a predetermined plurality of times at which said voltage is increased by said increment and said period of time is varied, wherein said increment and said period of time are varied such that a first increment is smaller than a second increment and a first period of time is longer than a second period of time, said first increment being defined as said increment by which said voltage is increased at each of said predetermined plurality of times, said second increment being defined as an increment by which said voltage is increased prior to each of said predetermined plurality of times, said first period of time being defined as a period of time during which said voltage is kept constant after each of said predetermined plurality of times, and said second period of time being defined as a period of time during which said voltage is kept constant prior to each of said predetermined plurality of times.

8. A method of deleting data stored in a non-volatile semiconductor memory device that includes a first gate insulating film formed on a channel region of a semiconductor substrate, a floating gate electrode formed on said first gate insulating film, a second gate insulating film formed on said floating gate electrode, and a control gate electrode formed on said second gate insulating film, said method, comprising:

applying at least one pulse across said control gate electrode and said semiconductor substrate, said at least one pulse comprising a negative voltage and a pulse width;

determining whether a threshold voltage of said non-volatile semiconductor memory device is less than or equal to a turning point voltage;

determining whether a time period, during which said at least one pulse is applied, is less than or equal to a predetermined time period;

increasing said negative voltage of said at least one pulse by a first increment, if said time period, during which said at least one pulse is applied, is less than or equal to said predetermined time period; and increasing said negative voltage by a second increment and said pulse width of said at least one pulse, if said threshold voltage is less than or equal to said turning point voltage, wherein said second increment of said negative voltage is less than said first increment.

9. The method of deleting data stored in a non-volatile semiconductor memory device of claim 8, further comprising:

determining whether said threshold voltage of said non-volatile semiconductor memory device equals a final threshold voltage value; and stopping an application of said at least one pulse, when said threshold voltage equals said final threshold voltage value.

10. The method of deleting data stored in a non-volatile semiconductor memory device of claim 8, further comprising:

setting a source and a drain of said non-volatile semiconductor memory device to a floating condition.

* * * * *